United States Patent [19]
Ting et al.

[11] Patent Number: 6,022,465
[45] Date of Patent: Feb. 8, 2000

[54] APPARATUS AND METHOD UTILIZING AN ELECTRODE ADAPTER FOR CUSTOMIZED CONTACT PLACEMENT ON A WAFER

[75] Inventors: Chiu H. Ting, Saratoga; William H. Holtkamp; Wen C. Ko, both of San Jose, all of Calif.

[73] Assignee: Cutek Research, Inc., San Jose, Calif.

[21] Appl. No.: 09/088,319

[22] Filed: Jun. 1, 1998

[51] Int. Cl.[7] .................................................. C25D 5/02
[52] U.S. Cl. ........................... 205/118; 205/122; 205/123
[58] Field of Search .................................... 205/118, 122, 205/123, 157

[56] References Cited

U.S. PATENT DOCUMENTS

| | | |
|---|---|---|
| 5,000,827 | 3/1991 | Schuster et al. . |
| 5,024,746 | 6/1991 | Stierman et al. . |
| 5,228,966 | 7/1993 | Murata ................................... 204/224 |
| 5,256,274 | 10/1993 | Poris . |
| 5,368,711 | 11/1994 | Poris . |
| 5,429,733 | 7/1995 | Ishida . |
| 5,437,777 | 8/1995 | Kishi . |
| 5,441,629 | 8/1995 | Kosaki . |
| 5,447,615 | 9/1995 | Ishida . |
| 5,516,414 | 5/1996 | Glafenhein et al. . |
| 5,830,805 | 11/1998 | Shacham-Diamand et al. . |
| 5,853,559 | 12/1998 | Tamaki et al. . |

FOREIGN PATENT DOCUMENTS

| | | |
|---|---|---|
| 2628886 | 7/1997 | Japan . |

OTHER PUBLICATIONS

Contolini, R., et al., A Copper Via Plug Process by Electrochemical Planarization, 1993 VMIC Conference—102/93/0470, Jun. 8–9, 1993, pp. 470–477.

Pai, Pei–Lin & Ting, Chiu, Copper as the Future Interconnection Material, 1989 VMIC Conference, TH–0259–2/89/0000–0258, Jun. 12–13, 1989, pp. 258–264.

Contolini, R., et al., Copper Electroplating Process for Sub–Half–Micron ULSI Structures, 1995 VMIC Conference—104/95/0322, Jun. 27–29, 1995, pp. 322–328.

Ting, Chiu H., et al., Recent Advances in Cu Metallization, 1996 VMIC Conference, 106/96/0481(c), Jun. 18–20, 1996, pp. 481–486.

Contolini, Robert J., et al., Electrochemical Planarization for Multilevel Metallization, J. Electrochem. Soc., vol. 141, No. 9, Sep. 1994, pp. 2503–2510.

Equinox—Single Substrate Processing System, A Semitool Brochure, EQU025–Apr. 1994, pp. 1.8–8.8.

*Primary Examiner*—Kathryn Gorgos
*Assistant Examiner*—Jonathan Brown
*Attorney, Agent, or Firm*—Blakely, Sokoloff, Taylor& Zafman LLP

[57] ABSTRACT

An apparatus and method for customizing electrode contact placement on a semiconductor wafer while depositing and/or removing a material on a semiconductor wafer. The present invention is a adapter having at least one opening through which at least one electrode contacts the semiconductor wafer. The adapter may be designed to have multiple openings at specified locations on the adapter, thus allowing multiple electrode contacts with the semiconductor wafer at pre-specified locations. A conductive sheet may couple with the adapter to carry an electrical current from an electrical conductor to the electrode contacts placed within the openings of the adapter.

27 Claims, 9 Drawing Sheets

APPARATUS AND METHOD UTILIZING AN ELECTRODE ADAPTER FOR CUSTOMIZED CONTACT PLACEMENT ON A WAFER

RELATED APPLICATION

The present invention is related to the U.S. Patent Application entitled "Process Chamber and Method for Depositing and/or Removing Material on a Substrate", Ser. No. 08/916,564, filed on Aug. 22, 1997(pending).

BACKGROUND OF THE INVENTION

1. Field of the Invention

The present invention relates to the field of semiconductor wafer processing and, more particularly, to an apparatus and method for customizing electrode contact placement on a semiconductor wafer while depositing and/or removing a material on a semiconductor wafer.

2. Description of the Related Art

In the manufacture of devices on a semiconductor wafer, it is the current practice to fabricate multiple levels of conductive layers on a substrate. In order to fabricate features, circuits, and devices on a substrate, such as a semiconductor wafer, various techniques may be used to deposit and etch materials on the substrate. Deposition techniques include processes such as physical vapor deposition (PVD), chemical vapor deposition (CVD), sputtering, and immersion of the substrate in an electrolyte solution. This last technique may be used for either electroless deposition or electroplating.

Similarly, a number of techniques are known for removing a material from a wafer. These techniques include reactive ion etching (RIE), plasma etching, chemical-mechanical polishing (CMP), and immersion of the wafer in an electrolyte solution. Material removal by subjecting an immersed wafer to an electric field employs an equivalent set-up to that used for electroplating, but with an opposite result since in this instance charged particles are removed rather than deposited on the wafer.

During the electroplating/electropolishing process, the wafer is immersed in an electrolyte solution and positioned in an electric field between a cathode and an anode such that charged particles are deposited/removed onto the surface of the wafer. More specifically in the electroplating technique, an anode is placed within the electrolyte solution and a cathode is brought into contact with the wafer.

In the past, the chuck or platform on which the wafer rested during processing acted as the cathode to create a uniform potential base across the bottom surface of the wafer. However, with the potential created along the bottom surface of the substrate, a potential gradient often resulted with the face of the wafer (the upper surface of the wafer being processed) due to resistance in the thickness of the wafer. Further, because a uniform potential was created across the bottom surface of the wafer, a potential gradient across the surface of the wafer could not be measured to determine resistance characteristics of the wafer.

The above problems may be avoided, however, by bringing the cathode into contact with the outer edge of the face of the wafer. Although a single cathode contact along the periphery of the face of the wafer being processed is sufficient to create the desired electric field, a more uniform current distribution across the wafer may be achieved by using multiple points of cathode contact around the outer edge of the wafer face. The points of cathode contact along the outer edge of the wafer face, however, must circumvent the design layout of the fabricated features, circuits, devices, etc. that are formed on the surface of the wafer.

For example, FIG. 1 shows the face of a processed wafer and identifies the unprocessed space along the periphery of the processed wafer as the scrap area 2. The specific size and shape of the scrap area of a given wafer is dictated by the specific design layout on the surface of that wafer. Thus, the placement of the cathode contacts must be pre-determined with respect to the final design layout of a processed wafer. FIG. 2 illustrates an example of the placement 4 of eight cathodes used to create a potential across the wafer. This particular cathode contact scheme, however, might not work with another wafer, depending on the intended design layout of the processed area. In such a case, either the processed area would have to be redesigned such that it did not coincide with the cathode contacts, or the processing equipment itself would have to be altered or replaced with equipment having the cathode contacts in the correct position for the given wafer. Each of these options is costly, time consuming, and inconvenient.

Current processing equipment typically consists of a processing chamber with the cathode(s) in a fixed position. The cathode(s) contact each wafer placed in the processing chamber at the same location on each wafer processed. If the point of cathode contact needs to be moved due to a change in the design layout of the wafer being processed, the processing chamber has to be replaced with one having the cathode(s) fixed in a different position. Thus, an apparatus that could couple to the processing equipment and allow a wafer manufacturer to easily change the number of cathode contact points and the cathode contact positions on the wafer during processing is desirable.

SUMMARY OF THE INVENTION

The present invention describes an adapter for customizing the placement of an electrode on a substrate, such as a semiconductor wafer, when processing the substrate. The present invention has at least one electrode coupled to the adapter. The adapter couples to a processing chamber such that an electrical current passes through the adapter to the electrode. The adapter may be designed to have multiple electrodes at specified locations on the adapter, thus allowing multiple electrode contacts with the wafer at pre-specified locations.

The adapter couples to a processing chamber used in the electroplating/electropolishing process. With the adapter, the processing equipment may be customized such that the number of electrodes utilized and the exact contact position of the electrode(s) on the face of the wafer being processed may be altered as needed. Thus, when the design layout of the processed area on the wafer face changes, a wafer manufacturer may modify the processing equipment by replacing the adapter with one designed to correlate the electrode contact points with the new design requirements.

DETAILED DESCRIPTION OF THE INVENTION

Figure 2:
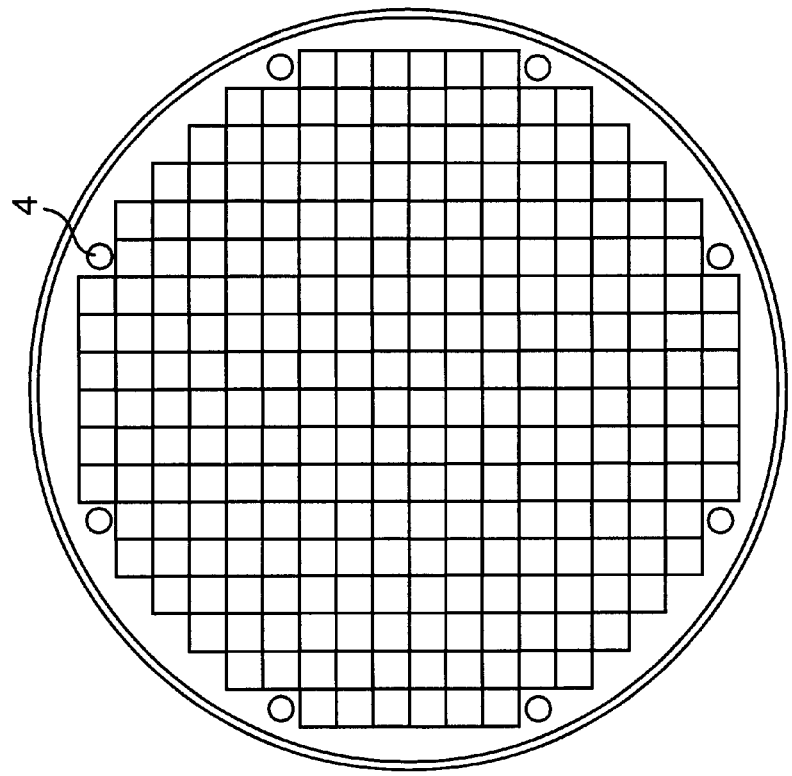
FIG. 2 illustrates an example of cathode contact placement that circumvents the design layout of a processed wafer.
Figure 1:
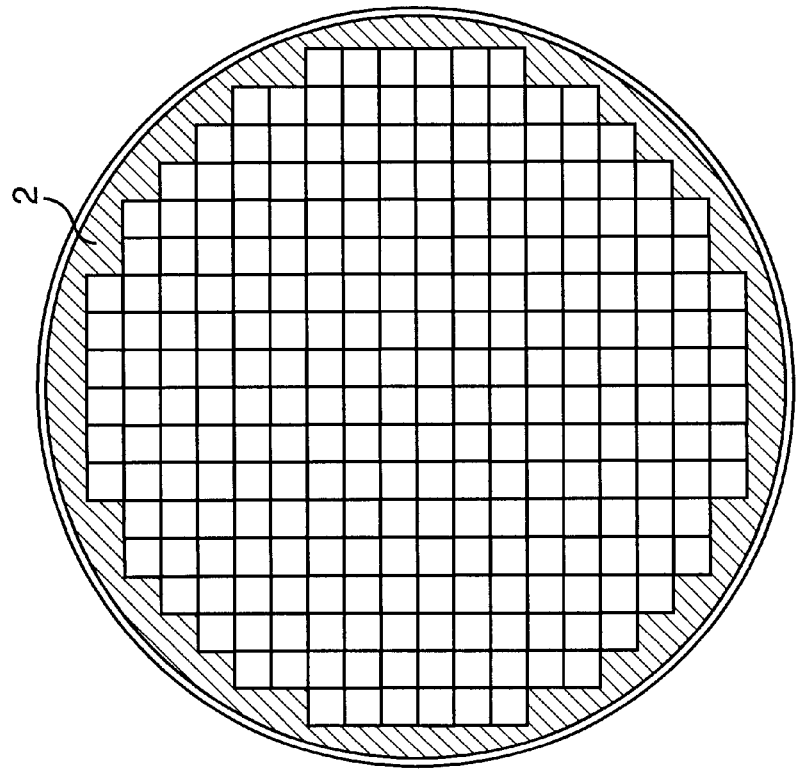
FIG. 1 illustrates an example of a design layout and scrap area of a processed wafer.

An adapter for customizing the placement location of an electrode on a semiconductor wafer during the electroplating and/or electropolishing process is described. In the following description, numerous specific details are set forth, such as specific structures, materials, processes, etc., in order to provide a thorough understanding of the present invention. However, one skilled in the art will appreciate that the present invention may be practiced without these specific details. In other instances, well known techniques and structures have not been described in detail in order not to obscure the present invention.

For ease of description, the apparatus described herein is discussed in view of depositing a material on a semiconductor wafer. However, the equipment described for depositing a material can be readily adapted to remove a particular material from a semiconductor wafer or other substrate by simply using different electrolytes and reversing the direction of the current flow in the chamber. Furthermore, the present invention need not be limited strictly to semiconductor wafers. The invention can be readily adapted to processing materials on other substrates, including substrates utilized for packaging semiconductor devices such as bump formation or ceramic substrates, and the manufacturing of flat panel displays.

During the electroplating process, a wafer is immersed in an electrolyte solution and positioned in an electric field between a cathode and an anode such that charged particles are deposited onto the surface of the wafer. An anode is placed within the electrolyte solution and at least one cathode is brought into contact with the face of the wafer (the upper surface of the wafer that is being processed). Although a single cathode contact along the periphery of the face of the wafer being processed is sufficient to create the desired electric field, a more uniform potential across the wafer face may be achieved by using multiple points of cathode contact around the outer edge of the wafer face. The points of cathode contact along the outer edge of the wafer face, however, must circumvent the design layout of the fabricated features, circuits, devices, etc. that are formed on the surface of the wafer.

The specific size and shape of the unprocessed space along the periphery of the processed wafer (the scrap area) is dictated by the specific design layout on the surface of that particular wafer. Thus, the placement of the cathode contacts must be pre-determined in light of the final design layout of a processed wafer. Current processing equipment typically consists of a processing chamber with the cathode(s) in a fixed position. The cathode(s) contact each wafer processed in the processing chamber at the same location on each wafer. If the point of cathode contact needs to be moved due to a change in the design layout of the wafer being processed, the processing chamber has to be replaced with one having the cathode(s) fixed in a different position. The present invention addresses this problem.

Figure 3:
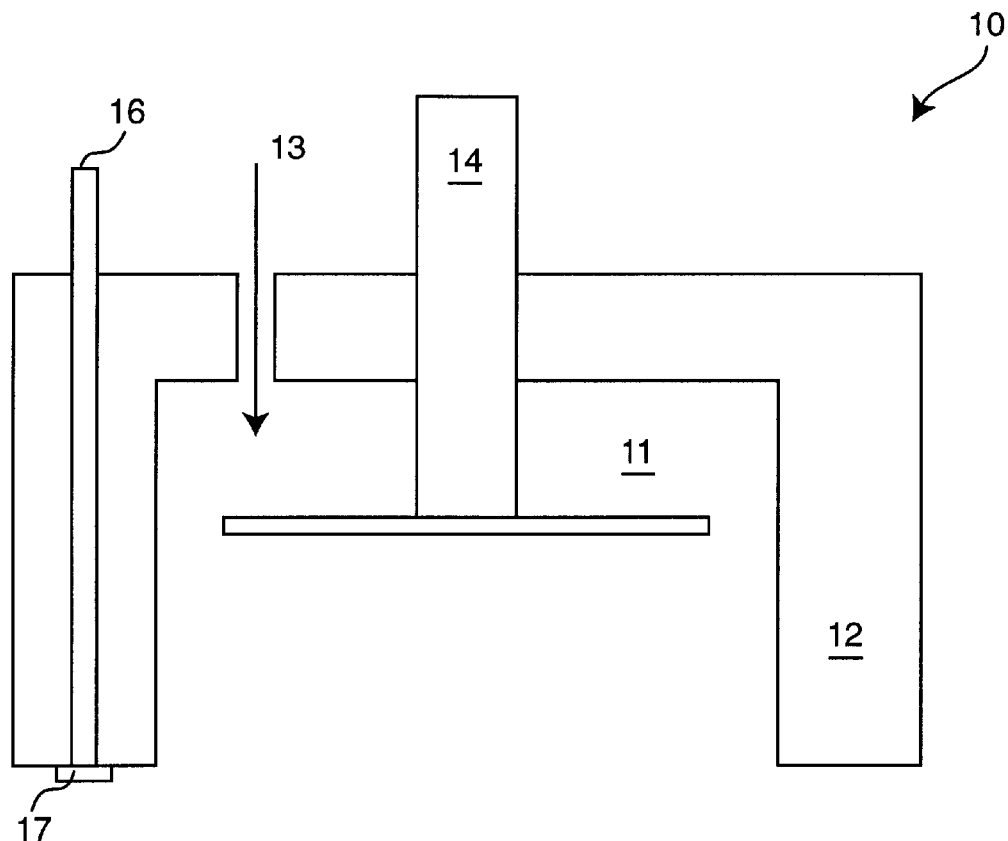
FIG. 3 illustrates a typical processing chamber for processing a material such as a semiconductor wafer.
Figure 3:
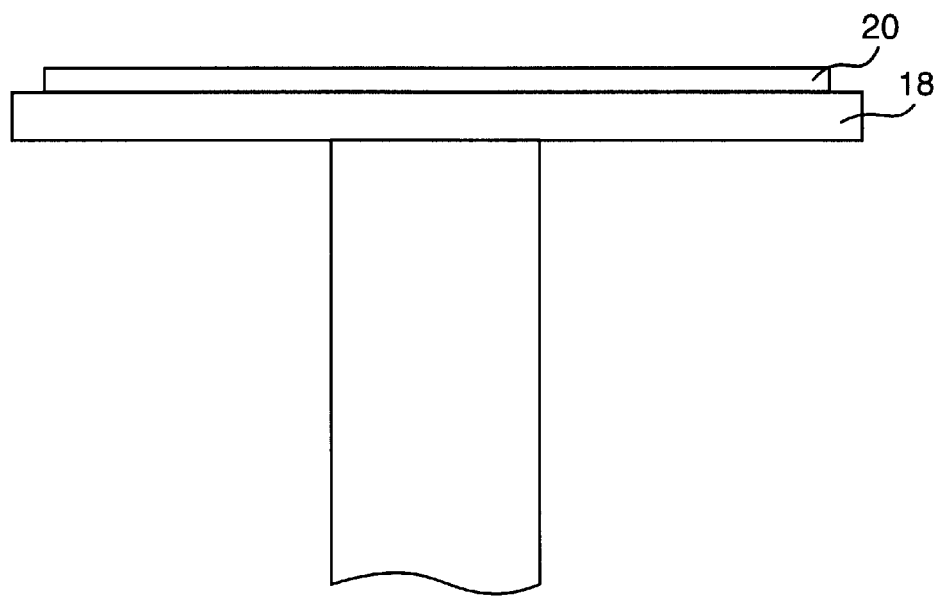

The present invention describes an adapter for use with processing equipment for customizing the placement of an electrode on a wafer when processing the wafer. An example of typical processing equipment is shown in FIG. 3. A hollow sleeve 12 forms a containment chamber 11 in which a processing fluid 13 may be contained during processing. An anode 14 is within the containment chamber 11. The sleeve 12 generally houses at least one electrical connector 16. When a wafer 20 is raised into position on a wafer support 18 such that the cathodes 17 permanently coupled to the connector 16 contact the face of the wafer 20, an electrical field is applied and charged particles are deposited onto the surface of the wafer 20. Note that either the electrical connector 16 itself may act as the cathode and directly contact the face of the wafer, or a separate electrode 17 may be permanently attached to the base of the connector 16.

Figure 4:
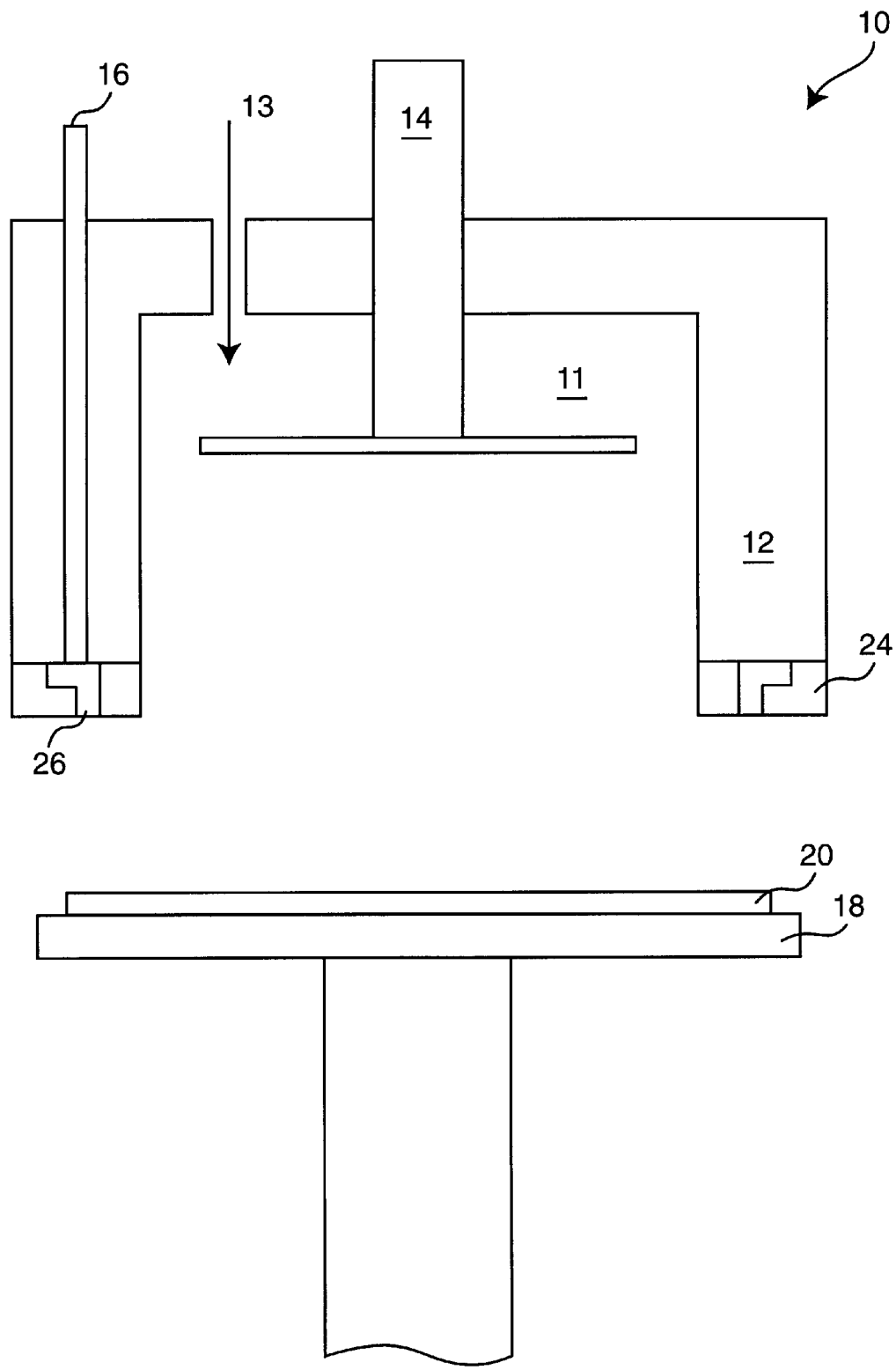
FIG. 4 illustrates the adapter of the present invention coupled to a typical processing chamber for customizing the placement of electrodes on a wafer during processing.

The present invention describes an adapter 24 that replaces the permanently affixed electrodes and couples to the sleeve 12, as shown in FIG. 4. An electrical current passes from the connector 16, through a current path established within adapter 24, to cathodes 26 attached to the adapter 24. The adapter 24 may be removed and replaced by one having a different number of cathodes or a different placement of the cathodes as dictated by the change in desired cathode contact points. With the adapter 24, the processing equipment 10 may be customized such that the number of electrodes utilized and the exact contact position of the electrodes on the face of the wafer being processed may be altered as needed.

The adapter of the present invention can be constructed by the use of the same various materials known for constructing processing chambers in general. As with the chamber and wafer support, the adapter will need to be made from materials that do not react with the processing chemical. Thus, if the adapter is made of stainless steel or other conductive material, it will need to have a protective coating (such as TEFLON™) to prevent the chemical reaction along the inner side of the adapter. The adapter may also be made of polypropylene, quartz, or ceramic. In these cases, however, the adapter must be modified to allow an electrical current to pass from the electrical conductor to the electrode (s) when the adapter is coupled to the processing chamber.

The adapter of the present invention is generally circular to conform to the shape of a circular wafer and a cylindrical processing chamber. However, the exact shape and size of the adapter is a design choice depending on the shape of the substrate to be processed and the shape of the chamber that the adapter is coupled to. The adapter is typically bolted to the process chamber with means including a seal to prevent leakage out of the side. Other attachment methods may also be employed that allow functionality.

Figure 5A:
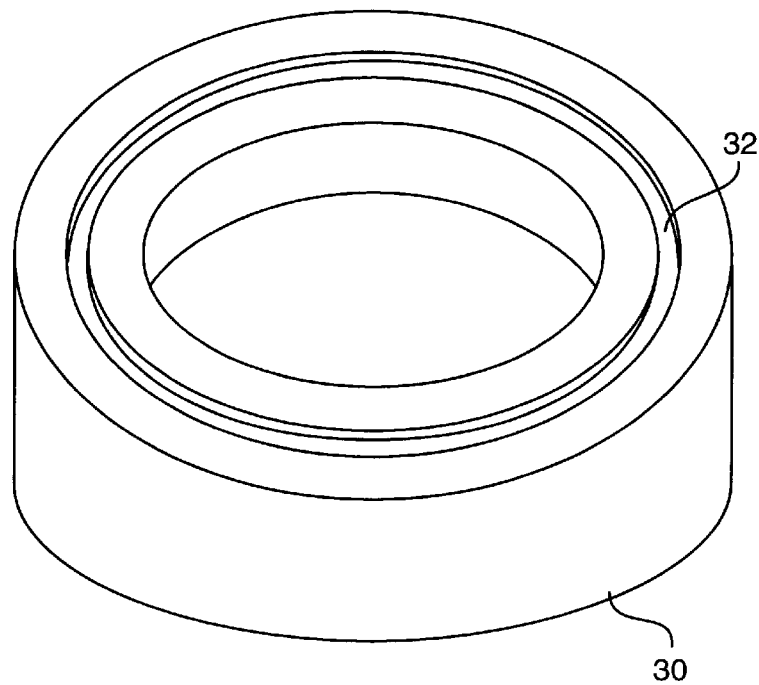
FIG. 5A is a pictorial illustration of a first embodiment of an adapter of the present invention for customizing electrode placement on a wafer face during processing of the wafer.
Figure 5B:
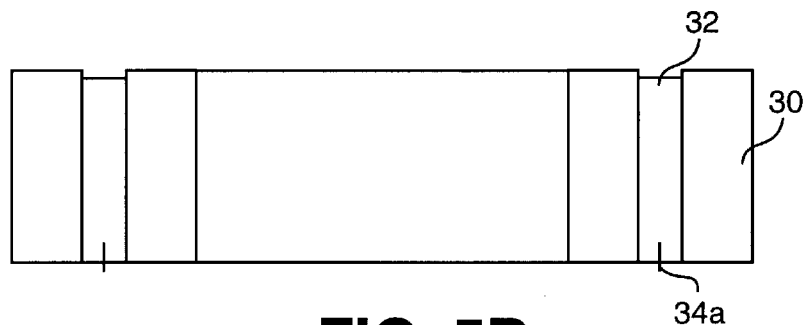
FIG. 5B is a cross-sectional view of the adapter shown in FIG. 5A showing the attached electrodes extending straight down.
Figure 5C:
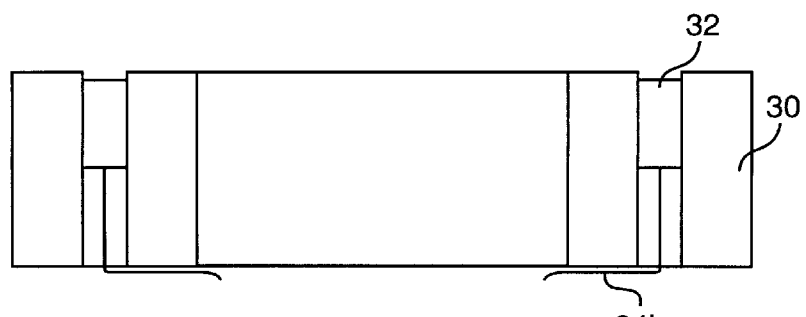
FIG. 5C is a cross-sectional view of the adapter showing the attached electrodes extending past the inner radius of the adapter.
Figure 5D:
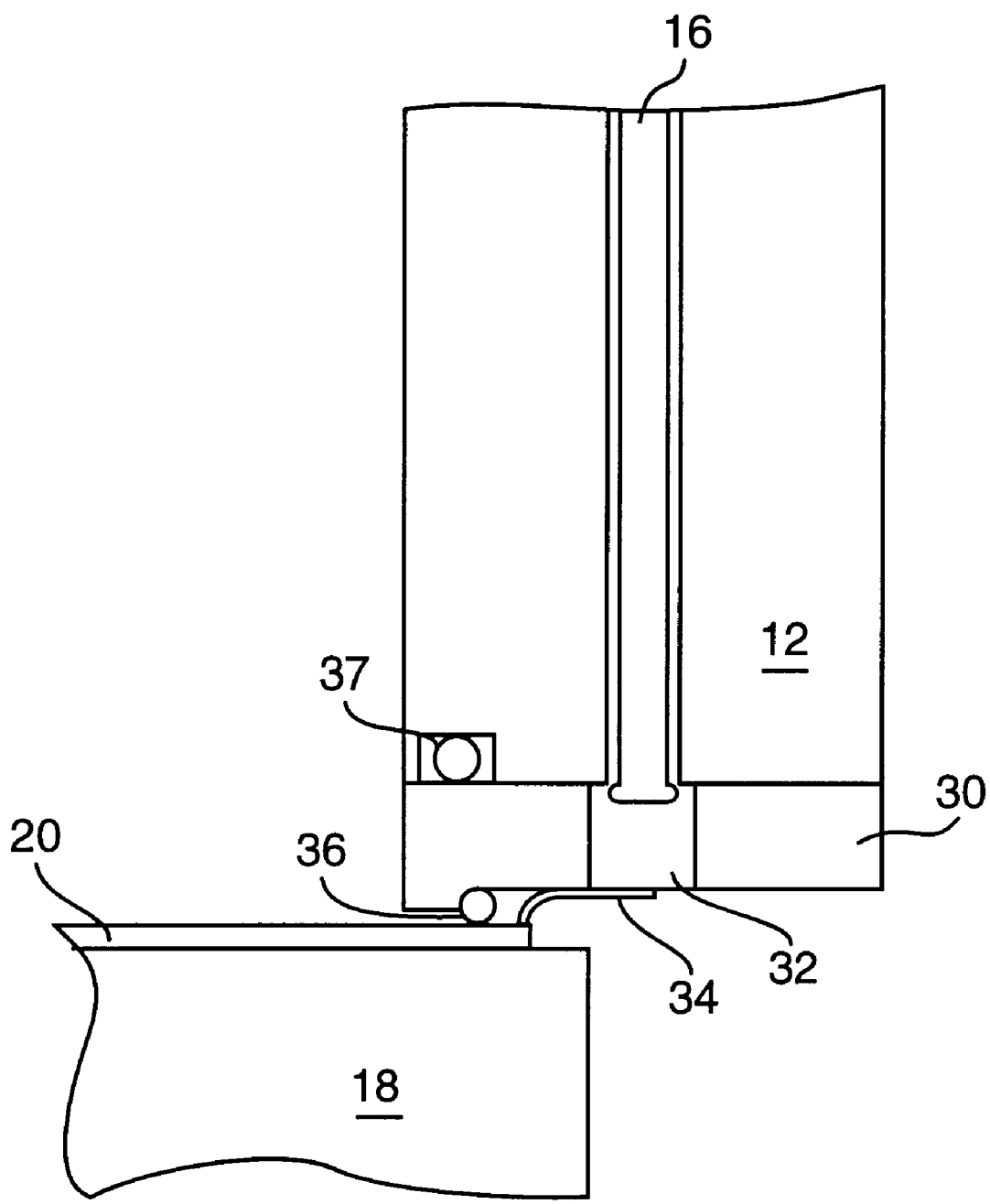
FIG. 5D is a cross-sectional view showing the adapter of FIG. 5A when coupled to the processing chamber of FIG. 4.

FIGS. 5A–5D illustrate a first embodiment of an adapter of the present invention for customizing electrode placement on the wafer face by the processing equipment during processing of the wafer. In this first embodiment, the adapter 30 is made of a non-conductive material such as polypropylene, quartz, or ceramic. A channel 32 of conductive material is encased within the adapter 30. The channel 32 is recessed slightly below the upper surface of the adapter 30, extends down through the depth of the adapter 30, and is flush with the lower surface of the adapter 30. As seen in FIG. 5D, when the adapter 30 is coupled to the sleeve 12, the channel 32 is not in contact with the sleeve 12. Thus, when the insulated electrical connector 16 carries a current to the conductive channel 32, the channel 32 will not polarize the sleeve 12 and so the sleeve is not limited to being made of a non-conductive material.

At least one electrode 34 is coupled to the adapter 30 such that it is in contact with the conductive channel 32 and will contact the semiconductor wafer 20 at the desired location when the adapter 30 is coupled to the sleeve 12 for the processing of the semiconductor wafer 20. The electrode 34a is coupled to the adapter 30 such that it extends straight down from the channel 32 of the adapter 30 (See FIG. 5B). Alternatively, the electrode 34b may be spring loaded and coupled to the adapter 30 such that it extends past the inner radius of the adapter (See FIG. 5D). The exact number and location of the electrodes used is a design choice dependent on the desired contact placement dictated by the wafer being processed. For example, with a 200 mm size wafer, the adapter will typically utilize four electrodes spaced equidistantly around the adapter 30.

Also noted in FIG. 5D are seals 36 and 37. A seal 37 is disposed between the sleeve 12 and the adapter 30 to prevent leakage between the two components 12 and 30. A seal 36 is disposed between the wafer end of the electrode 34b and an interior wall of the adapter 30. The seal 36 is positioned adjacent to the interior wall of the adapter 30 so that it can effectively inhibit the processing fluid used within the chamber during processing from reaching the electrode 34b when power is to be applied to the electrode 34b. It is to be appreciated that the process of electroplating or electropolishing will not actually occur until power is applied to the anode and cathode electrodes. However, once power is applied, there is a tendency for surfaces (other than wafer 20) in contact with the solution to undergo the plating or polishing process as well. Accordingly, by using the seal 36 to prevent the electrolyte from reaching the electrode 34b, the electrodes will not be plated/polished once power is applied. Thus, by sealing and protecting the electrodes 34b from the plating solution, no deposition will accumulate on (or material be removed from) the electrodes 34b. This prevents the build up (or removal) of material on/from the electrodes 34b, which material can become contaminants within the chamber during processing.

The seals 36 and 37 can be fabricated from a variety of materials which are resistant to the processing fluid being utilized. In the preferred embodiment, polypropylene or some other equivalent polymer (for example, VITON™ or TEFLON™ materials) is used. If the sleeve 12 is to mount flush with the wafer 20 along the complete periphery of the wafer 20, then an adapter seal may be utilized. The seals should effectively inhibit the electrolyte from reaching the electrode contacts 34b.

Figure 6A:
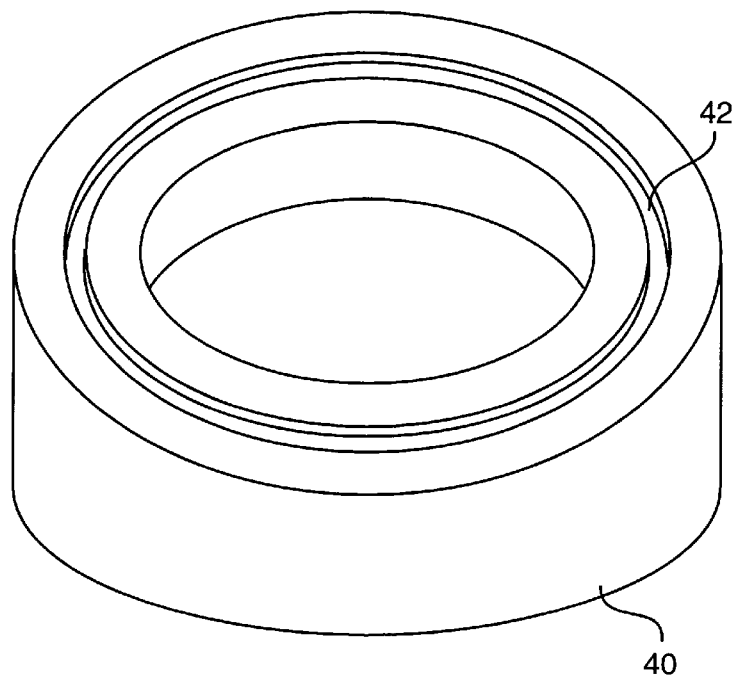
FIG. 6A is a pictorial illustration of a second embodiment of an adapter of the present invention for customizing electrode placement on a wafer face during processing of the wafer.
Figure 6B:
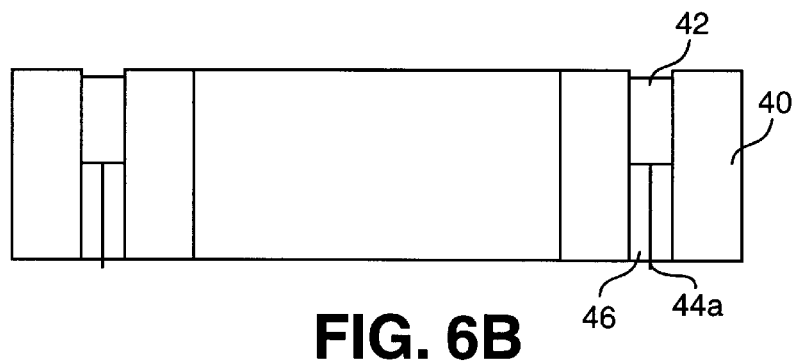
FIG. 6B is a cross-sectional view of the adapter shown in FIG. 6A showing the attached electrodes extending straight down.
Figure 6C:
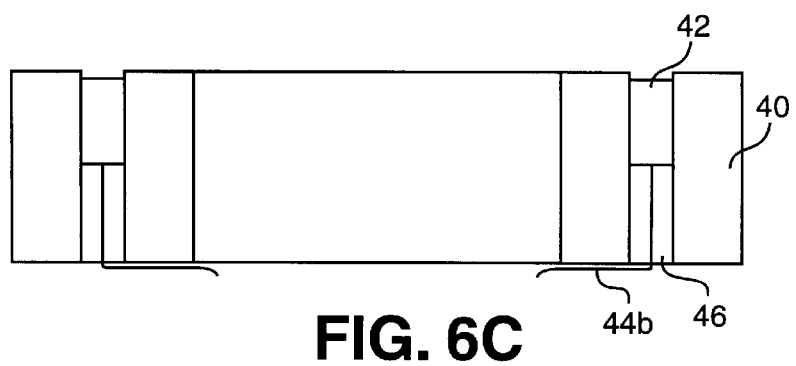
FIG. 6C is a cross-sectional view of the adapter shown in FIG. 6A showing the attached electrodes extending past the inner radius of the adapter.

A second embodiment of the preferred invention is illustrated in FIGS. 6A–6C. As with the first embodiment, the second embodiment has a conductive channel 42 encased within a non-conductive adapter 40. The channel 42 is recessed slightly below the upper surface of the adapter 40 and extends down through the adapter 40. However, rather than extending down to the lower surface of the adapter 40 as in the first embodiment, the channel 42 ends at some point between the upper and lower surface of the adapter 40. At the selected electrode contact points, there is an opening 46 at the lower surface of the adapter 40 that extends upward to the base of the channel 42. Thus, the number of openings corresponds with the number of electrodes required for the processing of a given wafer. An electrode 44 is coupled to the conductive channel and extends through the opening to contact the face of the wafer being processed. As with the first embodiment, the electrodes 44a may extend straight down from the opening, or the electrodes 44b may be spring loaded and angled to extend to a desired point of contact on the semiconductor wafer. The opening 46 may also be lined with a conductive material. In this manner, the electrical current could be carried from the conductive channel 42 by the conductive lining of the opening 46 to the electrodes 44. Thus, the electrodes 44 could be attached at the base of the opening 46 rather than at the base of the channel 42. As with the first embodiment a seal may be used to protect the electrodes 34 from the plating solution.

Figure 7A:
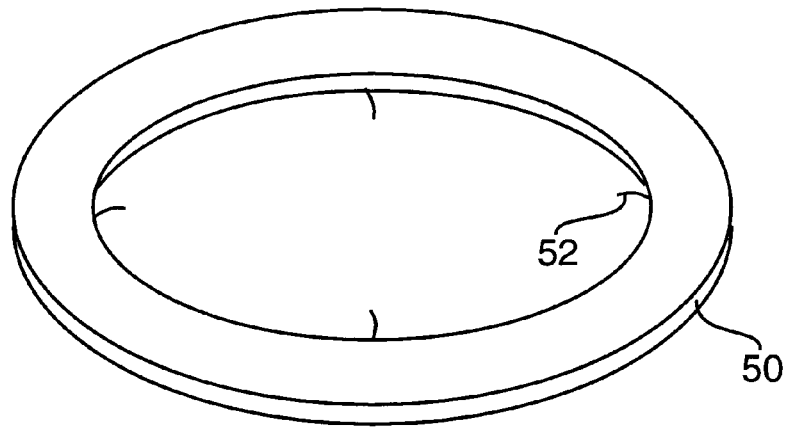
FIG. 7A is a pictorial illustration of a third embodiment of an adapter of the present invention for customizing electrode placement on a wafer face during processing of the wafer.
Figure 7B:
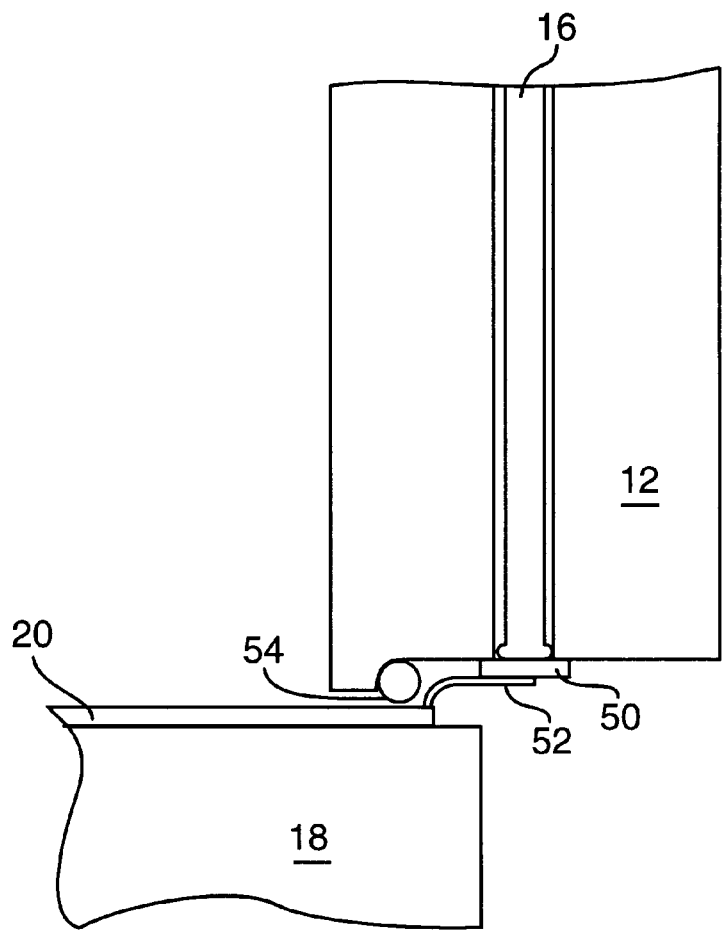
FIG. 7B is a cross-sectional view showing the adapter of FIG. 7A when coupled to the processing chamber of FIG. 4.

A third embodiment of the adapter of the present invention for customizing electrode placement on a wafer face during processing of the wafer is shown in FIG. 7. In this embodiment, the adapter 50 is a thin ring of conductive material that couples to the electrical conductor 16 housed within the sleeve 12 of the processing equipment. Electrodes 52 are coupled to the adapter 50 at the desired locations. Because the adapter 50 is conductive, it will react with the processing fluid when an electrical field is applied. Thus, use of a seal 54 such as that described above in the discussion of the first embodiment is preferred. In this embodiment, the seal 54 is disposed between the wafer end of the electrode 52 and an interior wall of the sleeve 12. The seal is positioned adjacent to the interior wall of the sleeve 12 so that it can effectively inhibit the processing fluid used within the chamber during processing from reaching the electrode 52 when power is applied to the electrode.

Figure 8:
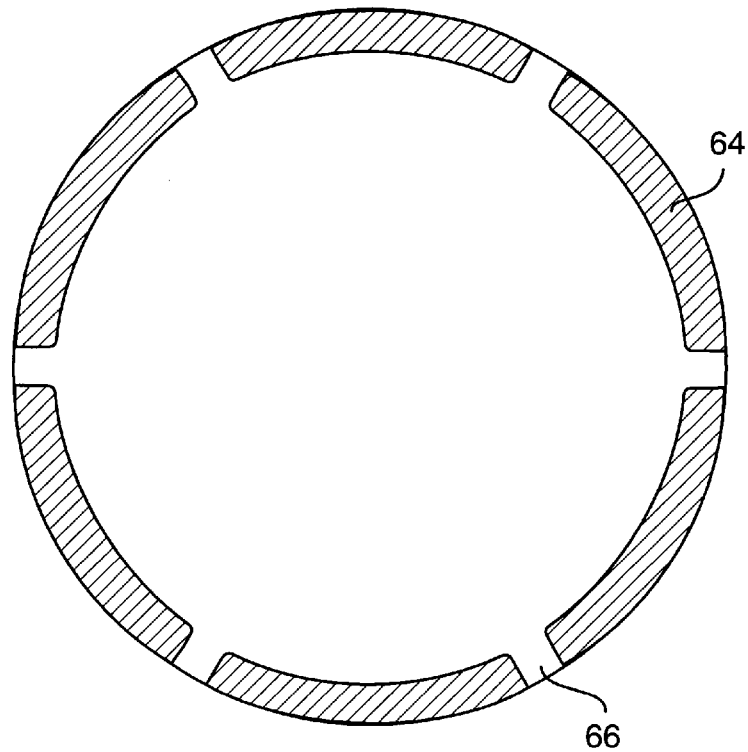
FIG. 8 is an illustration of electrode contact over an area of the wafer face rather than a specific point.

Having separate points of cathode across the surface of the wafer rather than a uninterrupted uniform contact across the surface of the wafer allows the manufacturer to measure the potential gradient at different locations across the wafer surface. Each of the embodiments described above has discussed the use of multiple electrodes having point contacts as shown in FIG. 2. However, multiple electrodes having an area contact may also be used. Area contact electrodes contact the wafer at a section or strip of area along the periphery of the wafer. Thus, the present invention can be designed to allow an entire section or strip of scrap area of the wafer to come into contact with an electrode. For an example, see FIG. 8. Areas 66 not in contact with an electrode would briefly divide the lengths of area 64 in contact with an electrode. As with the smaller individual contact points, measurements of the potential gradient could still be taken between the divided electrode contact areas.

Figure 9:
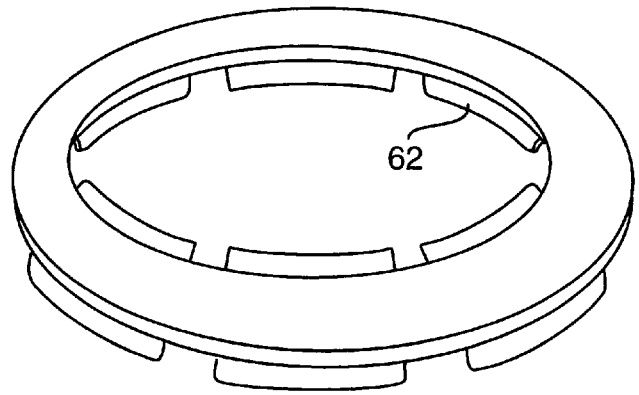
FIG. 9 a pictorial illustration of an embodiment of an adapter of the present invention for customizing electrode placement over a given area on a wafer face during processing of the wafer.

To allow electrode contact with the wafer over an area on the face of the wafer, each of the above embodiments could be modified such that the electrode(s) covers a larger contact area rather than a specific point. For example, FIG. 9 shows a modification of the above-described third embodiment allowing contact by the electrodes over a given area rather than a specific point. The electrodes 62 will contact a wafer in the contact areas illustrated in FIG. 8.

Figure 10:
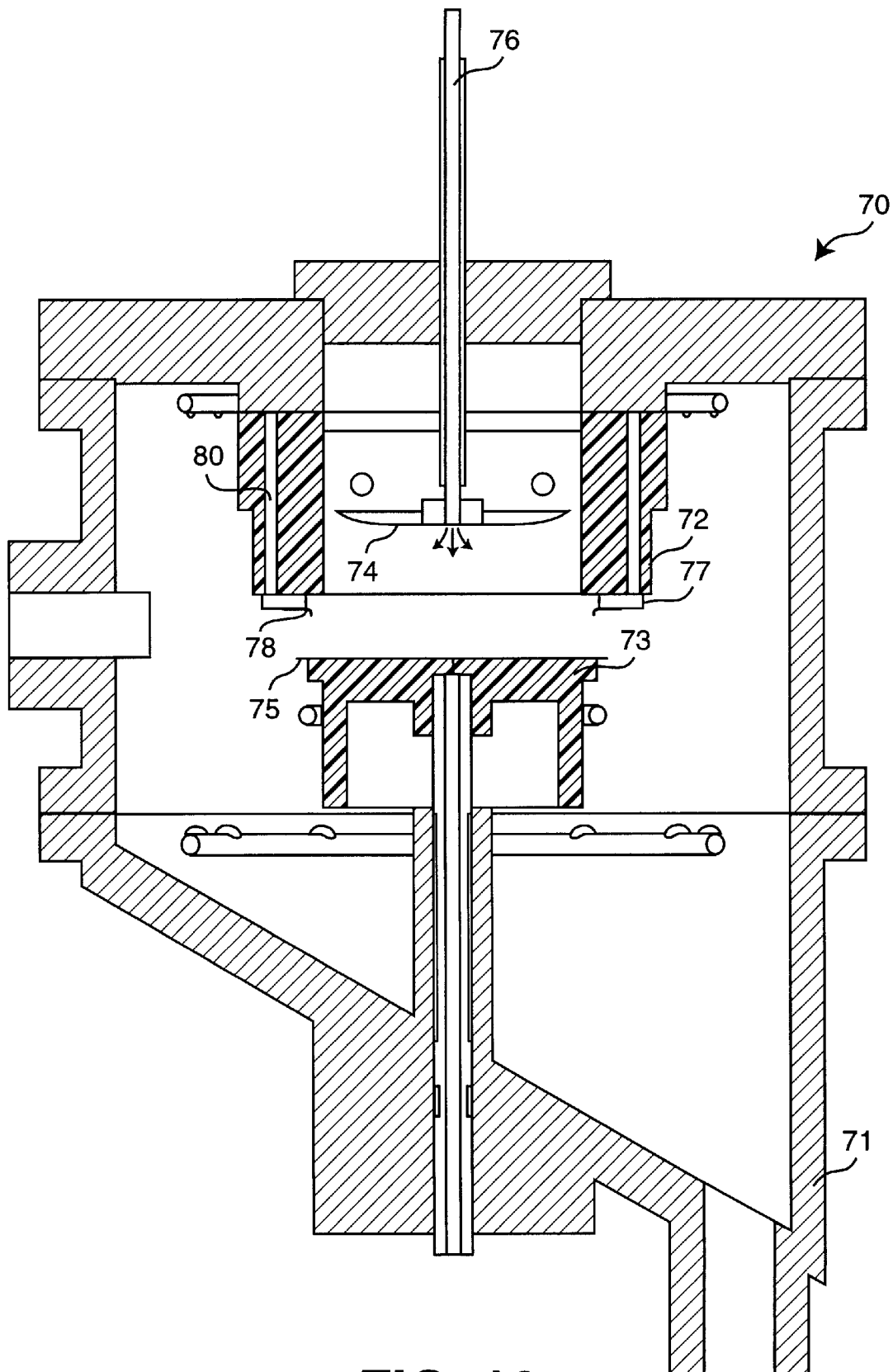
FIG. 10 is a cross-section of an adapter of the present invention coupled to a processing chamber for customizing the placement of electrodes on a wafer during processing.

Although the adapter of the present invention may be coupled to several different types of processing chambers, the preferred embodiment involves coupling the adapter with a processing chamber such as the one described in detail in the U.S. Patent Application entitled "Process Chamber and Method for Depositing and/or Removing Material on a Substrate", Ser. No. 08/916,564, filed on Aug. 22, 1997, and shown in FIG. 10. The processing chamber 70 includes an outer casing 71, inner fluid sleeve 72, wafer support 73, anode electrode 74, and fluid delivery and anode shaft 76. A wafer 75 is placed on the surface of the support 73 when it is to be processed within the chamber 70. The inner fluid sleeve 72 (also referred to as an inner processing chamber) is shaped as a hollow cylinder that is open at both ends. The sleeve 72 is utilized to hold (contain) the processing fluid when the wafer is being processed. The adapter 77 with the attached electrodes 78 couples to the lower end of sleeve 72.

When in position for the processing, the wafer 75 is raised to form the floor for the sleeve 72, so that the face of the wafer 75 is exposed to the electrolyte residing within the sleeve 72. It is to be noted that only the outer edge portion of the wafer 75 mates with the adapter 72. To create the desired electric field, the upper surface of the wafer 75 (the surface of the wafer exposed to the electrolyte within sleeve 72) is brought into contact with at least one cathode electrode 78. Within the wall of the sleeve 72 are hollow openings (or channels) 80. The channels 80 are utilized to couple electrical connections to the adapter 77 and cathodes 78 located at the bottom of the sleeve 72.

Thus, an adapter for customizing the placement of an electrode on a substrate, such as a semiconductor wafer, when processing the substrate is described. With the adapter, the processing equipment may be customized such that the number of electrodes utilized and the exact contact position of the electrodes on the face of the wafer being processed may be altered as needed. Thus, when the design layout of the processed area on the wafer face changes, a wafer manufacturer may modify the processing equipment by simply replacing the adapter with a new adapter designed to correlate the electrode contact points with the new design requirements. The adapter provides a way of modifying the processing equipment to fit the changing needs of the wafer manufacturer without the time-consuming and costly complete replacement of the chamber itself.

We claim:

1. An apparatus for electrode contact placement on a substrate during processing of the substrate comprising:
    an adapter disposed between the substrate and a processing chamber, said adapter having a bottom surface; and,
    at least one electrode coupled to said bottom surface of said adapter.

2. The apparatus of claim 1 wherein said adapter comprises conductive material.

3. The apparatus of claim 2 wherein said at least one electrode has a point contact.

4. The apparatus of claim 2 wherein said at least one electrode has an area contact.

5. An apparatus for electrode contact placement on a substrate during processing of the substrate, comprising:
    an adapter disposed between the substrate and a processing chamber, said adapter made of a non-conductive material, said adapter having a top surface and a bottom surface;
    a conductive channel coupled to said adapter; and,
    at least one electrode disposed within said conductive channel.

6. The apparatus of claim 5 wherein said at least one electrode has a point contact.

7. The apparatus of claim 5 wherein said at least one electrode has an area contact.

8. The apparatus of claim 5 wherein said conductive channel has an upper surface and a lower surface, said channel coupled to said adapter such that said upper surface of said conductive channel is below said top surface of said adapter.

9. The apparatus of claim 8 wherein said lower surface of said conductive channel is flush with said bottom surface of said adapter.

10. The apparatus of claim 9 wherein said electrode is coupled to said lower surface of said conductive channel.

11. The apparatus of claim 8 wherein said lower surface of said conductive channel is above said bottom surface of said adapter.

12. The apparatus of claim 11 wherein said adapter further comprises at least one opening from said bottom surface of said adapter to said lower surface of said conductive channel.

13. The apparatus of claim 12 wherein said electrode is coupled to said conductive channel and extends through said opening.

14. The apparatus of claim 5 wherein said adapter is comprised of polypropylene, quartz, or ceramic.

15. An apparatus for customizing electrode contact placement on a substrate during processing of the substrate, comprising:
    a support for having the substrate reside thereon;
    a hollow sleeve for forming a containment chamber to contain a processing fluid for processing said substrate, said sleeve having a lower end and an upper end;
    a first electrode coupled to reside within said hollow sleeve;
    an adapter coupled to said lower end of said sleeve;
    at least one second electrode coupled to said adapter;
    said support when raised to engage said sleeve causes said substrate to enclose said lower end of said sleeve by forming an enclosing floor for said containment chamber to retain said processing fluid therein; and,
    said second electrode contacting a surface of said substrate exposed to said processing fluid when said substrate is subjected to an electric field generated by a potential difference between said first electrode and said second electrode.

16. The apparatus of claim 15 wherein said at least one second electrode is protected from said processing fluid during processing.

17. The apparatus of claim 15 wherein said first electrode is an anode electrode and said at least one second electrode is a cathode electrode for electroplating the substrate.

18. The apparatus of claim 15 wherein said first electrode is a cathode electrode and said at least one second electrode is an anode electrode for electropolishing said substrate.

19. The apparatus of claim 15 wherein said second electrode has a point contact.

20. The apparatus of claim 15 wherein said second electrode has an area contact.

21. The apparatus of claim 15 further comprising an electrical conductor housed within a channel in said sleeve.

22. The apparatus of claim 21 wherein said adapter is in contact with said electrical conductor when said adapter is coupled to said lower end of said sleeve.

23. A method for customizing electrode contact placement on a substrate during processing of said substrate comprising the steps of:

placing a substrate to be processed on a support;

providing a hollow sleeve to form a containment chamber to contain a processing fluid for processing said substrate, said sleeve having a lower end and an upper end;

providing a first electrode within said hollow sleeve;

providing an adapter having at least one second electrode coupled to said adapter;

coupling said adapter to said lower end of said sleeve;

raising said support to engage said sleeve so that said substrate encloses said lower end of said sleeve by forming an enclosing floor for said containment chamber to retain said process fluid therein;

placing said processing fluid in said containment chamber; and applying a potential across said first and second electrodes to process said substrate.

24. The method of claim 23 wherein said step of providing said adapter includes providing a plurality of said second electrodes coupled to said adapter which are distributed around the circumference of said substrate during processing and are protected from said processing fluid during processing.

25. The method of claim 23 wherein said step of filling said containment chamber includes filling said containment chamber with an electrolyte for electroplating said substrate.

26. The method of claim 23 wherein said step of filling said containment chamber includes filling said containment chamber with an electrolyte for electropolishing said substrate.

27. A system for electrode placement on a substrate during processing of the substrate, comprising:

a processing chamber;

at least one electrode coupled to the chamber;

a substrate with electrode contacts; and an adapter disposed between the substrate and the processing chamber;

wherein the adapter is customized for electrically coupling the at least one electrode to the electrode contacts during processing.

* * * * *